(12) United States Patent
Sawatari et al.

(10) Patent No.: US 10,681,820 B2
(45) Date of Patent: Jun. 9, 2020

(54) CIRCUIT BOARD AND MANUFACTURING METHOD THEREFOR

(71) Applicant: TAIYO YUDEN CO., LTD., Tokyo (JP)

(72) Inventors: Tatsuro Sawatari, Tokyo (JP); Norio Sekiguchi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 16/291,547

(22) Filed: Mar. 4, 2019

(65) Prior Publication Data

US 2019/0274220 A1 Sep. 5, 2019

(30) Foreign Application Priority Data

Mar. 2, 2018 (JP) .................. 2018-037264

(51) Int. Cl.
*H05K 1/11* (2006.01)
*H05K 1/18* (2006.01)
(Continued)

(52) U.S. Cl.
CPC ........... *H05K 3/0052* (2013.01); *H05K 1/119* (2013.01); *H05K 3/0035* (2013.01);
(Continued)

(58) Field of Classification Search
CPC .... H05K 3/0052; H05K 1/119; H05K 3/0035; H05K 3/06; H05K 1/185; H05K 2203/1184; H05K 2201/09909; H05K 2203/0323; H05K 1/0284; H05K 1/0298; H05K 1/056; H05K 1/053; H05K 1/09; H05K 1/11; H05K 1/111; H05K 1/112;
(Continued)

(56) References Cited

U.S. PATENT DOCUMENTS 4,769,270 A * 9/1988 Nagamatsu ............ H05K 1/056
174/255
5,232,548 A * 8/1993 Ehrenberg ............. H05K 3/462
216/18
(Continued)

FOREIGN PATENT DOCUMENTS

JP 5415649 B1 2/2014
JP 2018-029140 A 2/2018

*Primary Examiner* — Ishwarbhai B Patel
(74) *Attorney, Agent, or Firm* — Saliwanchik, Lloyd & Eisenschenk (57) ABSTRACT

A circuit board includes: a metal core base material including a first main surface, a second main surface on an opposite side of the first main surface, a side surface, and a projection that projects from the side surface; an outer cover including a first insulation layer that covers the first main surface, a second insulation layer that covers the second main surface, and a third insulation layer that covers the side surface; a first wiring layer provided in the first main surface with the first insulation layer interposed between the first wiring layer and the first main surface; a second wiring layer provided in the second main surface with the second insulation layer interposed between the second wiring layer and the second main surface; and a sealing portion that is made of an insulation material embedded in the outer cover and covers an end surface of the projection.

4 Claims, 9 Drawing Sheets

(51) Int. Cl.
*H05K 3/00* (2006.01)
*H05K 3/06* (2006.01)
*H05K 1/02* (2006.01)
*H05K 1/05* (2006.01)

(52) U.S. Cl.
CPC .......... *H05K 1/0284* (2013.01); *H05K 1/056* (2013.01); *H05K 1/111* (2013.01); *H05K 1/181* (2013.01); *H05K 1/185* (2013.01); *H05K 3/06* (2013.01); *H05K 2201/09909* (2013.01); *H05K 2203/0323* (2013.01); *H05K 2203/1184* (2013.01)

(58) Field of Classification Search
CPC .......... H05K 1/113; H05K 1/18; H05K 1/181; H05K 1/182; H05K 1/183; H05K 2201/0358; H05K 2201/0361; H05K 2201/04; H05K 2201/049; H05K 2201/09745; H05K 2201/09063; H05K 2201/09127; H05K 2201/095; H05K 2201/09536; H05K 2201/09554; H05K 2201/10666; H05K 2201/10674
See application file for complete search history.

(56) References Cited

U.S. PATENT DOCUMENTS

| | | | |
|---|---|---|---|
| 6,844,504 B2* | 1/2005 | Wang | H05K 3/0052 174/255 |
| 2010/0012360 A1* | 1/2010 | Takahashi | H01L 23/142 174/257 |
| 2013/0081870 A1* | 4/2013 | Furutani | H05K 3/445 29/832 |
| 2014/0126157 A1 | 5/2014 | Sawatari et al. | |

* cited by examiner

CIRCUIT BOARD AND MANUFACTURING METHOD THEREFOR

CROSS-REFERENCE TO RELATED APPLICATION

This application claims the benefit of Japanese Priority Patent Application JP 2018-037264, filed Mar. 2, 2018, the entire contents of which are incorporated herein by reference.

BACKGROUND

The present disclosure relates to a circuit board including a metal core and a manufacturing method therefor.

In recent years, there is a demand for achieving further downsizing and higher density mounting of wiring boards and package components to be installed in electronic devices. In particular, with a board including a built-in component, the mounting density can be increased and the board can be downsized in comparison with a conventional component mount board. Therefore, it contributes to downsizing and thinning of a portable electronic device such as a mobile telephone and a digital camera.

For example, Japanese Patent No. 5415649 has disclosed a multi-layer wiring board with a built-in electronic component, which includes a metal core base material including a cavity in which the electronic component is placed. The wiring board of this type is manufactured by using an assembled board in which a plurality of core base materials are connected to one another via a plurality of bridge portions. After a wiring layer is formed and components are mounted in a batch, dicing is performed by a dicer cutting the bridge portions along division lines.

SUMMARY

In the thus manufactured wiring board, end surfaces of the bridge portions, which are parts of the core base materials, are exposed from a peripheral surface of the board when dicing is performed. Therefore, in a circuit module including the wiring board of this type, solder may flow and spread on the end surfaces of the bridge portions at the time of mounting on a mother board, which may cause a short circuit failure.

In view of the above-mentioned circumstances, it is desirable to provide a circuit module capable of ensuring reliability for mounting by soldering and a manufacturing method therefor.

In accordance with an embodiment of the present disclosure, there is provided a circuit module includes a metal core base material, an outer cover, a first wiring layer, a second wiring layer, and a sealing portion.

The core base material includes a first main surface, a second main surface on an opposite side of the first main surface, a side surface, and a projection that projects from the side surface.

The outer cover includes a first insulation layer that covers the first main surface, a second insulation layer that covers the second main surface, and a third insulation layer that covers the side surface.

The first wiring layer is provided in the first main surface with the first insulation layer interposed between the first wiring layer and the first main surface.

The second wiring layer is provided in the second main surface with the second insulation layer interposed between the second wiring layer and the second main surface.

The sealing portion is made of an insulation material embedded in the outer cover and covers an end surface of the projection.

In the circuit module, the projection in the side surface of the core base material is covered with the sealing portion. Therefore, it is possible to inhibit solder from being held in contact with the projection at the time of mounting. With this, the reliability of mounting by soldering can be ensured.

The sealing portion may include an outer surface portion and an inner surface portion.

The outer surface portion has a first thickness equal to a sum of a thickness of the projection, a thickness of the first insulation layer, and a thickness of the first wiring layer and is continuous with a peripheral surface of the outer cover.

The inner surface portion has a second thickness equal to the thickness of the projection and is adjacent to the end surface of the projection.

The outer surface portion may be formed on a same plane as the peripheral surface of the outer cover.

The projection may be located on a side of the first main surface with respect to a center of the side surface in a height direction, the third insulation layer may include a first portion located between the first insulation layer and the second insulation layer, and a second portion located between the second insulation layer and the projection, and the sealing portion may be arranged adjacent to the second portion in a thickness direction.

The sealing portion may be made of an insulation material including a same organic material as the outer cover.

In accordance with an embodiment of the present disclosure, there is provided a manufacturing method for a circuit board includes preparing a metal assembled board including an aperture formed along a division line, and a bridge portion that couples a plurality of core base materials to each other, the plurality of core base materials facing each other while sandwiching the aperture between the plurality of core base materials.

The aperture is filled with an insulation material.

Wiring layers are formed on both surfaces of the assembled board with an insulation layer interposed between each of the wiring layers and each of the surfaces of the assembled board.

The insulation layer is partially removed and a part of the bridge portion is exposed to an outside.

A part of the bridge portion is removed by dissolving.

A removed region of the insulation layer and the bridge portion is filled with an insulation material.

As described above, in accordance with the present disclosure, it is possible to ensure circuit board's reliability for mounting by soldering.

These and other objects, features and advantages of the present disclosure will become more apparent in light of the following detailed description of best mode embodiments thereof, as illustrated in the accompanying drawings.

DETAILED DESCRIPTION OF EMBODIMENTS

Hereinafter, an embodiment of the present disclosure will be described with reference to the drawings.

Figure 1:
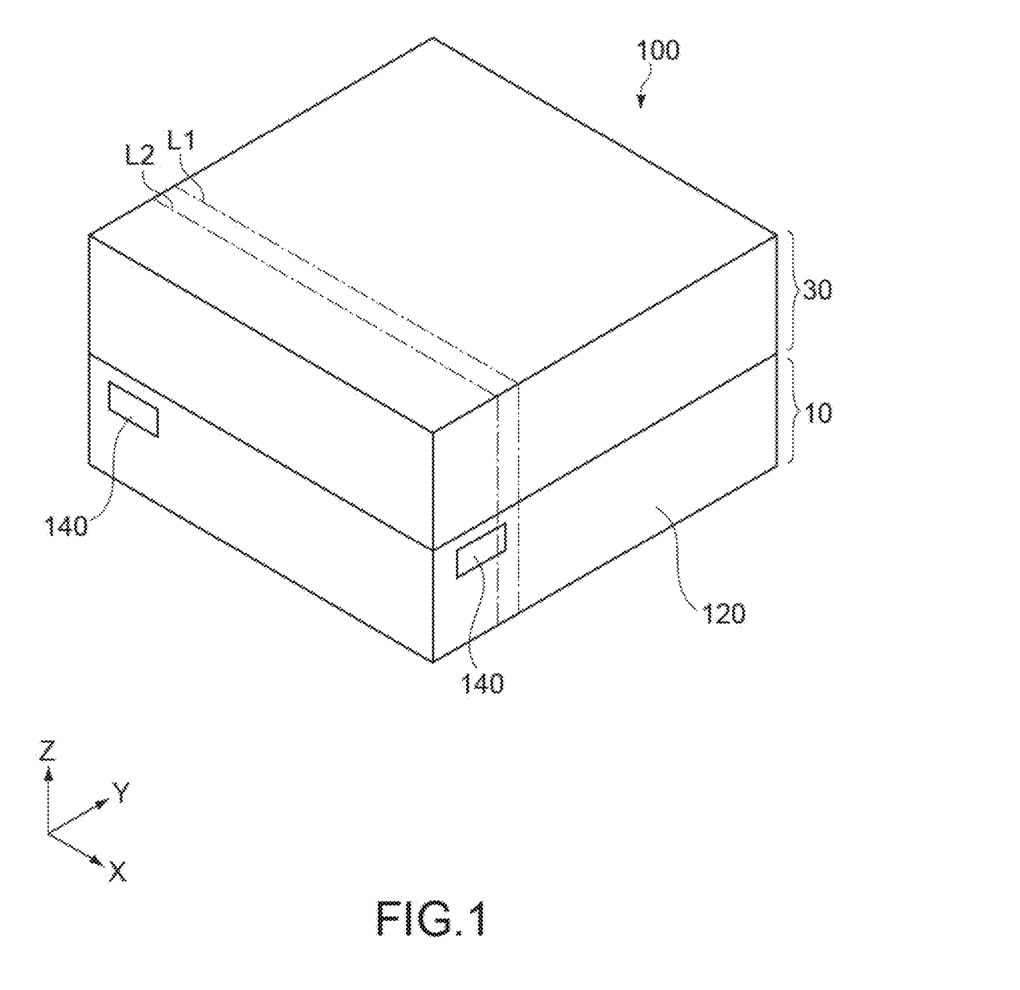
FIG. 1 is a perspective view of an outer appearance of a circuit module including a circuit board according to an embodiment of the present disclosure.
Figure 2:
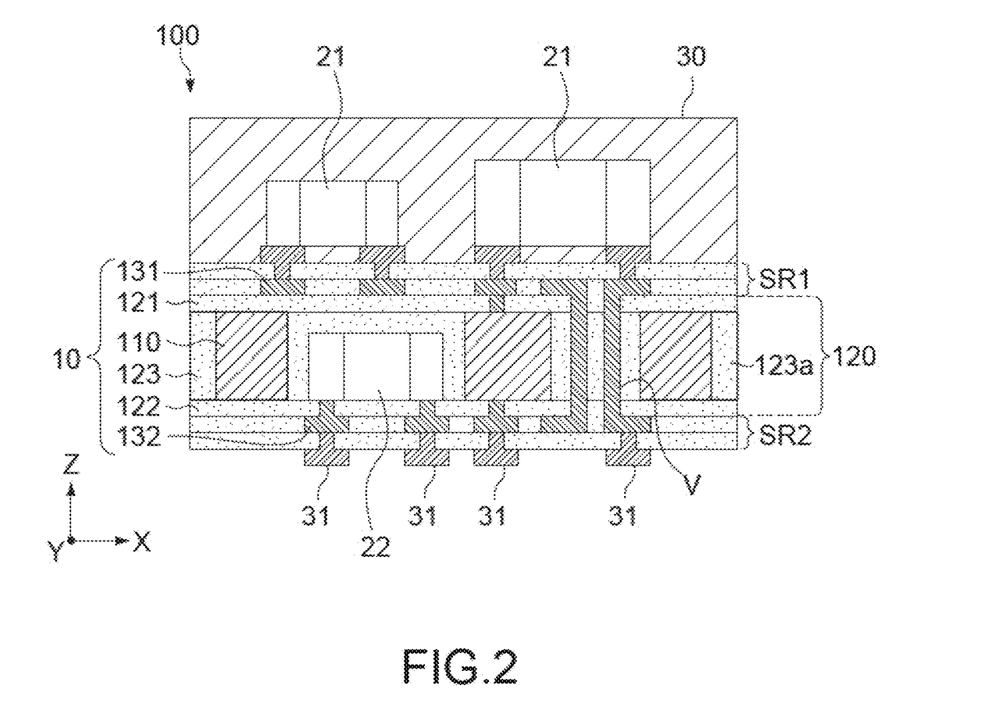
FIG. 2 is a schematic cross-sectional view taken along the L1 line of FIG. 1.
Figure 3:
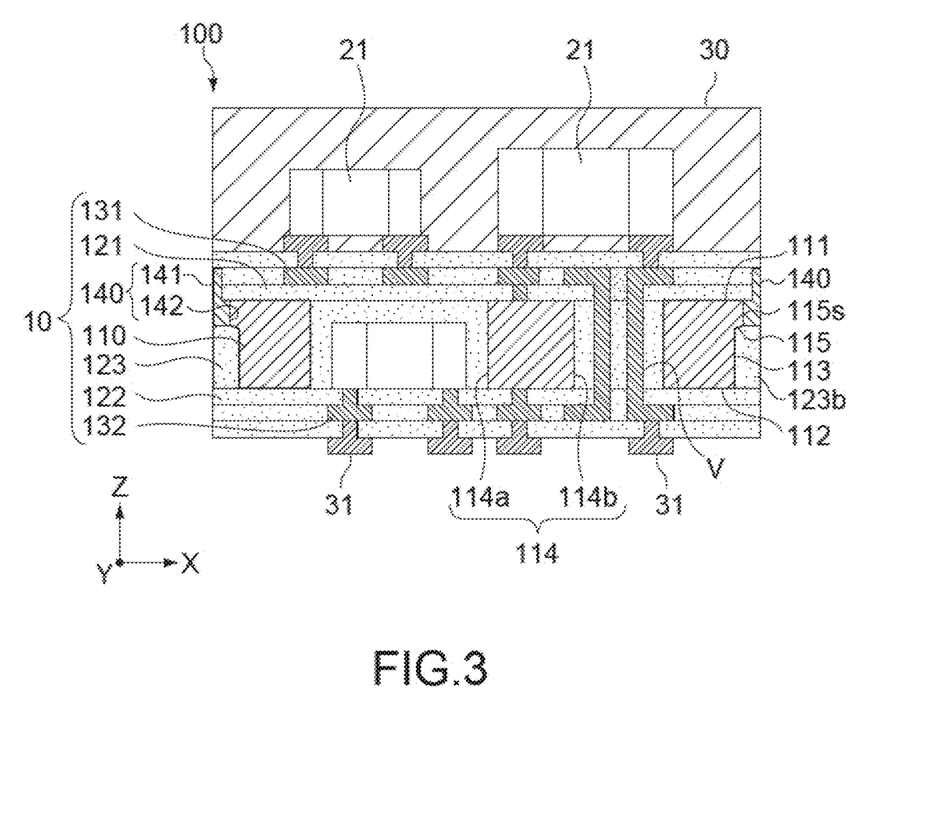
FIG. 3 is a schematic cross-sectional view taken along the L2 line of FIG. 1.

FIG. 1 is a perspective view of an outer appearance of a circuit module including a circuit board according to an embodiment of the present disclosure. FIG. 2 is a schematic cross-sectional view taken along the L1 line of FIG. 1. FIG. 3 is a schematic cross-sectional view taken along the L2 line of FIG. 1.

It should be noted that an X-axis, a Y-axis, and a Z-axis indicate three axis directions orthogonal to one another in each figure and FIGS. 2 and 3 are cross-sectional views as viewed in a Y-axis direction.

A circuit module 100 according to this embodiment includes a circuit board 10, a plurality of electronic components 21 mounted on a surface (component mount surface) of the circuit board 10, a built-in component 22 placed inside the circuit board 10, and a mold portion 30 that covers the electronic components 21. It should be noted that the built-in component 22 is omitted in some cases and a cavity of a built-in region is omitted in those cases.

In the circuit module 100, a predetermined electronic circuit including the electronic components 21 and the built-in component 22 is three-dimensionally constructed.

The circuit module 100 is configured to be mountable on a mount substrate (mother board) (not shown) with external connection terminals 31 (see FIG. 2) interposed between the circuit module 100 and the mount substrate. The external connection terminals 31 are provided in a back surface (terminal surface) of the circuit board 10.

Subsequently, the circuit board 10 will be described in detail.

Circuit Board

As shown in FIGS. 2 and 3, the circuit board 10 includes a metal core base material 110, an outer cover 120, a first wiring layer 131, a second wiring layer 132, and a sealing portion 140.

The core base material 110 is constituted by a metal plate having a predetermined thickness (e.g., 35 to 500 μm), which is made of copper, copper alloy (metal containing copper as a main material), stainless steel, or metal containing iron as a main material. A plan shape of the core base material 110 is a rectangular shape. The core base material 110 includes a first main surface 111, a second main surface 112, and four side surfaces 113. A plurality of cavities 114 are formed (see FIG. 3) in a layer of the core base material 110. The plurality of cavities 114 each include a component-containing hole 114a for containing the built-in component 22, a containing via-hole 114b for containing an inter-layer connection portion V, and the like.

A projection 115 is provided at a predetermined position of each of the side surfaces 113. The projection 115 outwardly projects in a direction perpendicular to the side surface 113 by a predetermined length. The projection 115 is typically provided in each of the four side surfaces 113 of the core base material 110. The thickness of the projection 115 is smaller than the height of the side surface 113 (the thickness of the core base material 110). The thickness of the projection 115 is equal to or ½ to ¼ of the height of the side surface 113, for example. The position at which the projection 115 is formed is not particularly limited. In this embodiment, the projection 115 is located on a side of the first main surface 111 with respect to the center of the side surface 113 in the direction of the thickness. Further, a part (in the figure, an upper surface) of the projection 115 forms the same plane as the first main surface 111.

As will be described later, in an assembled board of the core base materials 110 which is used in manufacturing the circuit board 10, the projections 115 form parts of bridge portions coupling the plurality of adjacent core base materials 110 to one another. The projection 115 is not limited to the projection 115 located on the side of the first main surface 111 with respect to the center of the direction of the height of the side surface 113 as an example. The projection 115 may be located on a side of the second main surface 112. Projection(s) 115 located on the side of the first main surface 111 and projection(s) 115 located on the side of the second main surface 112 may be both provided.

The outer cover 120 has a structure in which a first insulation layer 121, a second insulation layer 122, and a third insulation layer 123 are stacked. The first insulation layer 121 covers the first main surface 111 of the core base material 110. The second insulation layer 122 covers the second main surface 112 of the core base material 110. The third insulation layer 123 covers the side surfaces 113 of the core base material 110.

As shown in FIG. 3, the third insulation layer 123 covers each of the side surfaces 113, having a thickness (depth) larger than the projection length of the projection 115 from the side surfaces 113. The third insulation layer 123 includes first portions 123a located between the first insulation layer 121 and the second insulation layer 122 and second portions 123b located between the second insulation layer 122 and the projections 115. That is, in the side surfaces 113 of the core base material 110, the first portions 123a cover regions in which the projections 115 are not formed and the second portions 123b cover regions directly under the projections 115.

The first insulation layer 121, the second insulation layer 122, and the third insulation layer 123 are typically made of the same synthetic resin material. For example, the first insulation layer 121, the second insulation layer 122, and the third insulation layer 123 are made of an epoxy resin, a bismaleimide-triazine (BT) resin, a polyimide resin, or a composite material obtained by mixing a filler such as glass fibers therein. The resin material of the third insulation layer 123 is also filled in the cavities 114 of the core base material 110. The first insulation layer 121 and the second insulation layer 122 may be made of the same material while the third insulation layer 123 may be made of a material different from that of the first insulation layer 121 and the second insulation layer 122.

The first wiring layer 131 is provided in the first main surface 111 of the core base material 110 with the first insulation layer 121 interposed between the first wiring layer 131 and the first main surface 111. The second wiring layer 132 is provided in the second main surface 112 of the core base material 110 with the second insulation layer 122 interposed between the second wiring layer 132 and the second main surface 112.

The first wiring layer 131 and the second wiring layer 132 are typically constituted by copper foil and are patterned and formed in arbitrary shapes. A part of the first wiring layer 131 is connected to the first main surface 111 of the core base material 110 through a via-hole penetrating the first insulation layer 121. A part of the second wiring layer 132 is connected to the second main surface 112 of the core base material 110 through a via-hole penetrating the second insulation layer 122.

The first wiring layer 131 and the second wiring layer 132 are covered with insulation protection films such as solder resists SR1 and SR2. The solder resists SR1 and SR2 include apertures at appropriate positions. The first wiring layer 131 is connected to a terminal portion of the electronic components 21 and the second wiring layer 132 is connected to the external connection terminals 31 via those apertures. It should be noted that at least one insulation layer and at least one electrically conductive layer are stacked on each of the both surfaces of the core base material 110. FIG. 2 shows an example in which two electrically conductive patterns are formed on each of the both surfaces of the core base material 110. However, one electrically conductive pattern may be formed on each of the both surfaces of the core base material 110.

The sealing portion 140 is made of an insulation material embedded in the outer cover 120 and covers an end surface 115s of the projection 115. The sealing portion 140 is formed on the same plane as a peripheral surface of the outer cover 120 (outer peripheral surface). As shown in FIG. 3, the sealing portion 140 is arranged to be adjacent to the second portion 123b of the third insulation layer 123 in the thickness direction (in the Z-axis direction). The sealing portion 140 has a multi-stage structure of a thick wall portion (see the reference sign T2 in FIG. 8) that covers the end surface 115s of the projection 115 and a thin wall portion (see the reference sign T1 in FIG. 8) that covers the first insulation layer 121 located thereon.

More specifically, as shown in FIG. 3, the sealing portion 140 includes an outer surface portion 141 and an inner surface portion 142. The outer surface portion 141 includes an outer surface continuous with the peripheral surface of the outer cover 120. The outer surface portion 141 has a first thickness (height in the Z-axis direction) equal to a sum of the thickness of the projection 115, the thickness of the first insulation layer 121, and the thickness of the first wiring layer 131. On the other hand, the inner surface portion 142 includes a second thickness equal to the thickness of the projection 115 and is adjacent to the end surface 115s of the projection 115.

The sealing portion 140 is made of an insulation material including the same organic material as the outer cover 120 (the first insulation layer 121, the second insulation layer 122, and the third insulation layer 123). With this, the affinity with the outer cover 120 is enhanced, and thus the adhesion of the sealing portion 140 to the outer cover 120 is enhanced and the sealing portion 140 can be inhibited from falling or being pealed. Like the constituent material of the outer cover 120, the sealing portion 140 may contain an inorganic filler such as fibers made of glass or carbon, glass cloth, silicon oxide, aluminum oxide, and calcium carbonate.

In the circuit board 10 of this embodiment configured as described above, the projections 115 of the side surfaces 113 of the core base material 110 are covered with the sealing portions 140. Thus, the end surfaces 115s of the projections 115 are inhibited from being exposed to an outside from the peripheral surface of the outer cover 120. With this, the solder can be inhibited from being held in contact with the projection 115 at the time of mounting of the circuit module 100, and the reliability of mounting by soldering can be ensured without causing a short circuit failure and the like.

Further, the sealing portion 140 is formed on the same plane as the peripheral surface of the outer cover 120. Therefore, without forming a step in the peripheral surface of the outer cover 120, the outer cover 120 having the smooth peripheral surface can be obtained. With this, generation of foreign matters due to contact with a zig, cracking of the step, and the like at the time of handling can be suppressed.

Manufacturing Method for Circuit Board

Subsequently, a manufacturing method for the circuit board 10 will be described.

Figure 4A:
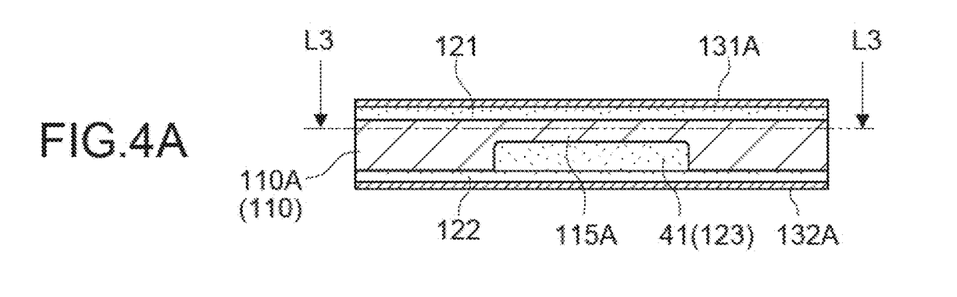
FIGS. 4A to 4D are schematic process diagrams of main parts for describing a manufacturing method for the circuit board.
Figure 4B:
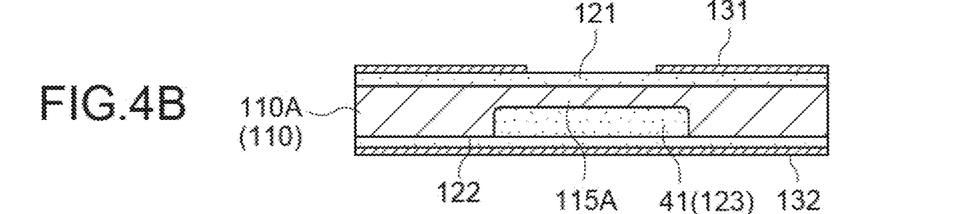
Figure 4C:
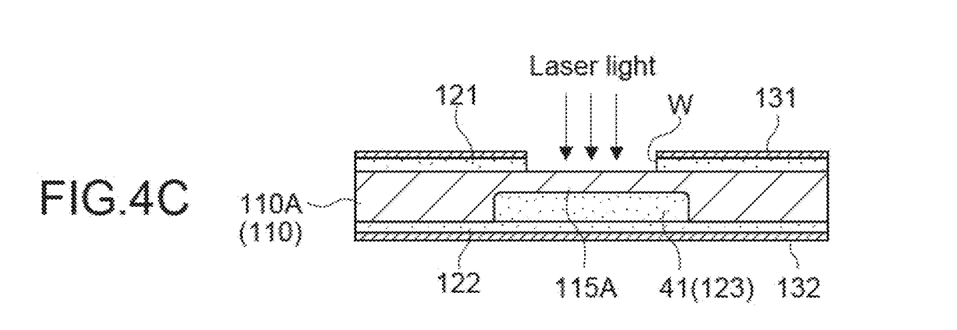
Figure 4D:
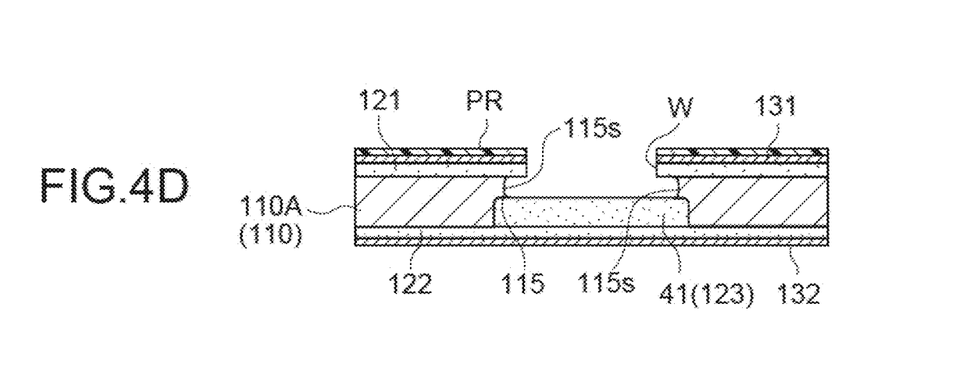
Figure 5A:
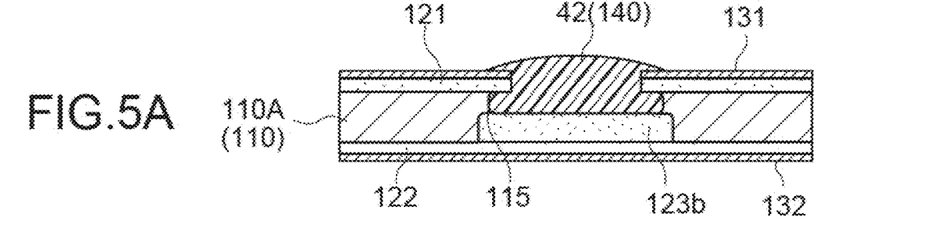
FIGS. 5A to 5C are schematic process diagrams of main parts for describing the manufacturing method for the circuit board.
Figure 5B:
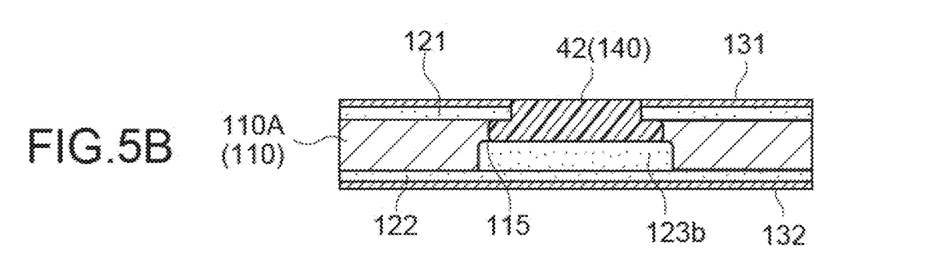
Figure 5C:
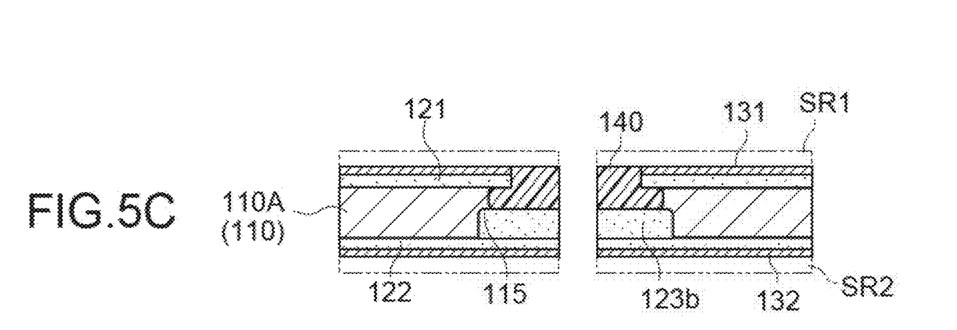
Figure 6A:
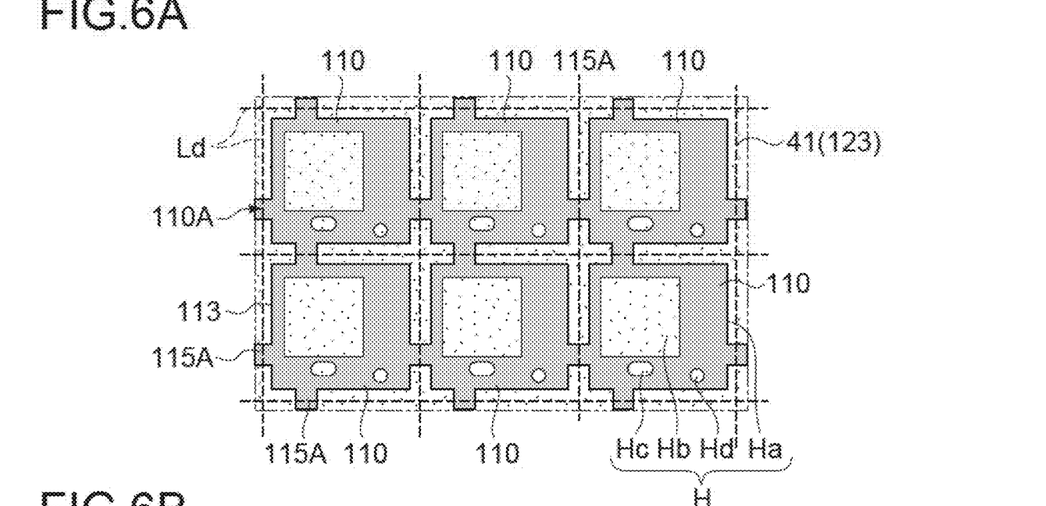
FIGS. 6A to 6C are schematic process diagrams of main parts for describing the manufacturing method for the circuit board.
Figure 6B:
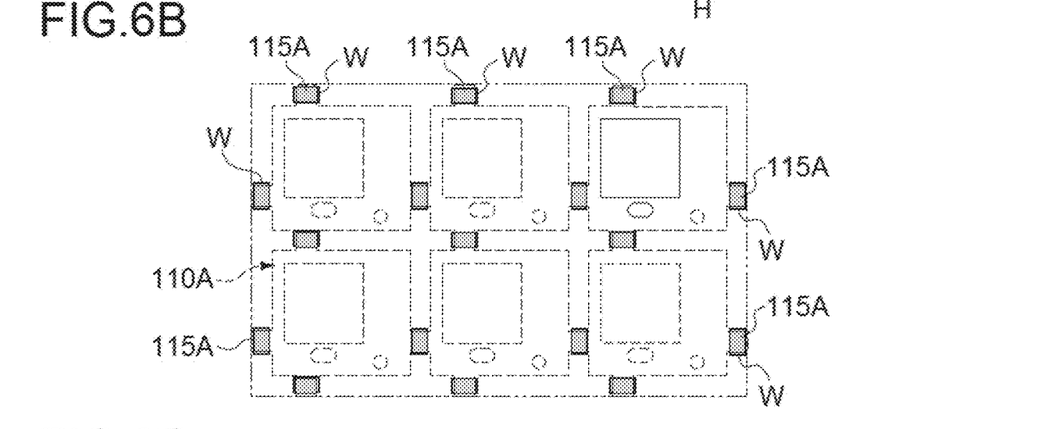
Figure 6C:
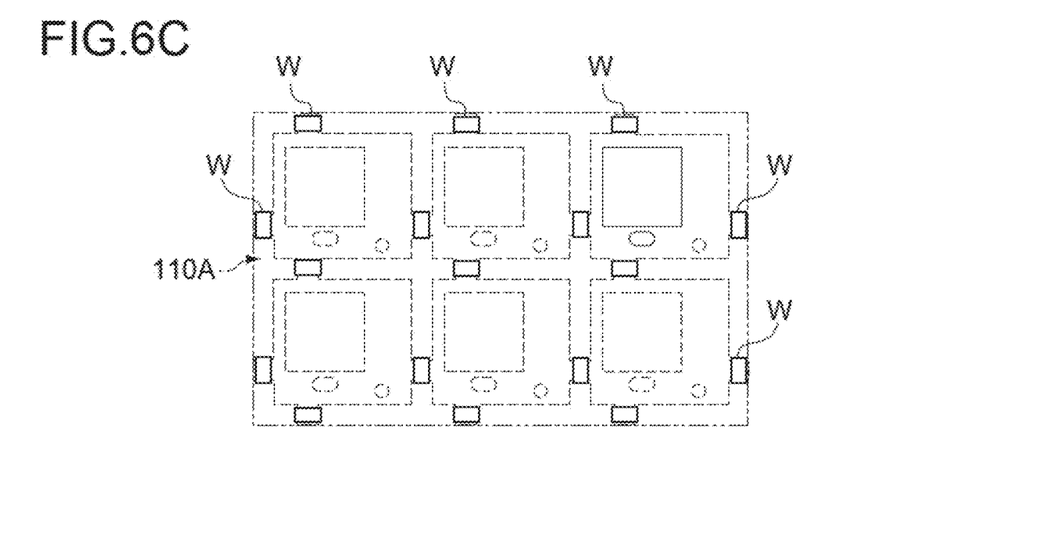
Figure 7A:
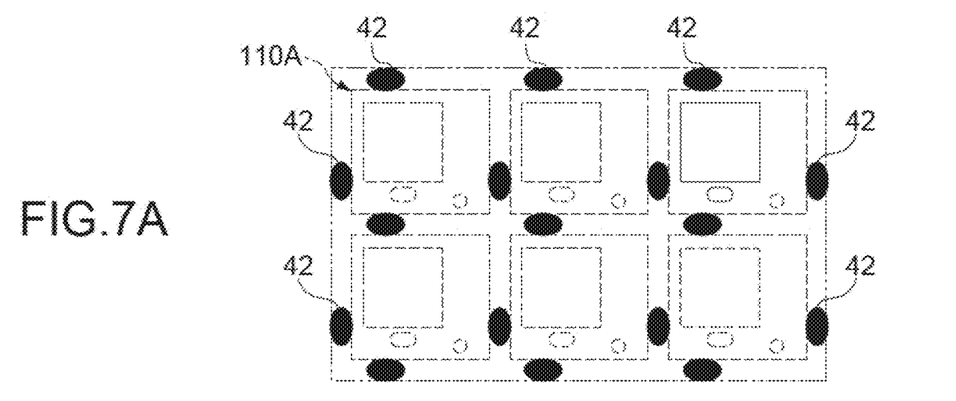
FIGS. 7A to 7C are schematic process diagrams of main parts for describing the manufacturing method for the circuit board.
Figure 7B:
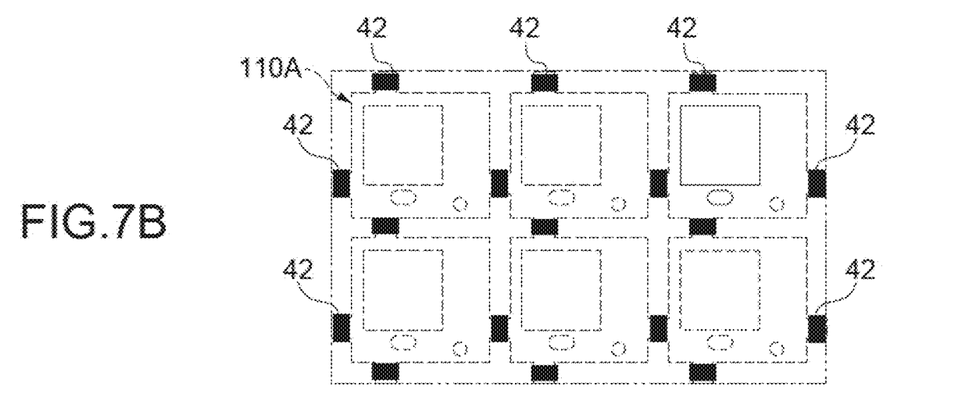
Figure 7C:
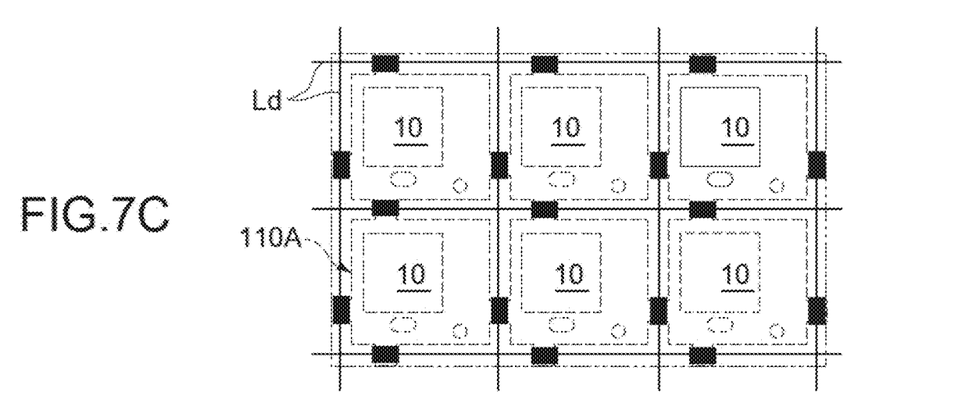

FIGS. 4 to 7 are schematic process diagrams of main parts for describing the manufacturing method for the circuit board 10. FIGS. 4 and 5 are side cross-sectional views. FIGS. 6 and 7 are schematic plan views.

First of all, as shown in FIG. 6A, a metal assembled board 110A is prepared. The metal assembled board 110A includes apertures Ha formed along division lines Ld and bridge portions 115A coupling the plurality of core base materials 110 to each other. The bridge portions 115A face each other while sandwiching the apertures Ha between the bridge portions 115A.

In other words, a rectangle formed by the division lines shown as dotted lines is one unit. Such units are vertically and horizontally arranged in a matrix form to form the assembled board 110A. In particular, the rectangular core base materials within the units are vertically and horizontally arranged and the respective rectangular core base materials are linked to one another through the bridge portions 115A. The assembled board is thus provided.

A plurality of apertures H including apertures Hb for containing the built-in components 22 (each corresponding to the component-containing hole 114a), apertures Hc for containing the inter-layer connection portions V (each corresponding to the containing via-hole 114b), and resin-filling apertures Hd as well as the apertures Ha are provided in the assembled board 110A. The bridge portions 115A are formed integrally with the side surfaces 113 of the core base material 110. The bridge portions 115A are formed at the same time as the formation of the apertures H.

The lay-out of the apertures H is not particularly limited and can be set as appropriate in a manner that depends on product specifications, size, and the like. For example, there is an advantage that formation of each of the component-containing apertures Hb having a relatively large opening size near the corner of the core base material 110 as shown in FIG. 6A makes it easy to ensure regions in which the other apertures Hc and Hd are formed.

The bridge portions 115A and the plurality of apertures H are typically formed by etching the assembled board 110A in the thickness direction with a predetermined etching solution. In particular, the plurality of apertures H are formed by full etching and the bridge portions 115A are formed half etching.

It should be noted that it may be formed by mechanical punching like a semiconductor lead frame. Note that at least the bridges are formed by etching before punching. It is because each of the bridge portions is constituted by a bridge having a thickness smaller than the thickness of the core base material.

For the manufacture of the circuit boards 10, the built-in components 22 are placed in the apertures Hb and then the plurality of apertures H of the assembled board 110A are filled with an insulation material 41 as shown in FIG. 6A.

The insulation material 41 corresponds to the third insulation layer 123 in the circuit board 10 (see FIGS. 2 and 3).

Subsequently, as shown in FIG. 4A, the first insulation layer 121 and the second insulation layer 122 are respectively formed in the both surfaces of the assembled board 110A (the first and second main surfaces 111 and 112 of the core base material 110). In addition, a first metal layer 131A and a second metal layer 132A are respectively stacked thereon. The first and second metal layers 131A and 132A are constituted by a copper plating layer or copper foil, for example.

Typically, preceding the formation of the first and second metal layers 131A and 132A, via-holes are formed in the first and second insulation layers 121 and 122. The via-holes electrically connect the core base material 110 or the built-in component 22 to the first and second metal layers 131A and 132A. Moreover, the inter-layer connection portions (penetrating holes) V are also formed in the core base material in a manner that depends on needs. Therefore, in that copper plating process, the front and rear sides of the core base material, the via-holes, and the inter-layer connection portions are also covered with a copper material or a copper material is embedded in the front and rear sides of the core base material, the via-holes, and the inter-layer connection portions.

Next, by patterning the first metal layer 131 and the second metal layer in predetermined shapes as shown in FIG. 4B, the first and second wiring layers 131 and 132 which are the electrically conductive patterns are formed (see FIGS. 2 and 3). A formation method for the first and second wiring layers 131 and 132 is not particularly limited. Typically, a photolithography technique is used therefor. In a formation process for the wiring layers 131 and 132, the electrically conductive patterns electrically connected to the connection portions of the inter-layer connection portion V and the inter-layer connection portions are formed. It should be noted that the electrically conductive patterns set forth herein refer to electrodes, wirings, and electrodes integral with wirings, and the electrode refers to a general term of electrodes for connection to mount components, electrodes for external connection, and the like.

Subsequently, by partially removing the first insulation layer 121 that covers each of the bridge portions 115A of the assembled board 110A as shown in FIGS. 4C and 6B, a window portion W that exposes a part of the bridge portion 115A to the outside is formed.

As a formation method for the window portion W, ablation of the first insulation layer 121 by irradiation with laser light such as $CO_2$ laser, for example, can be exemplified, though not limited thereto. Other techniques such as etching, drilling, and sandblasting can be employed.

Figure 8A:
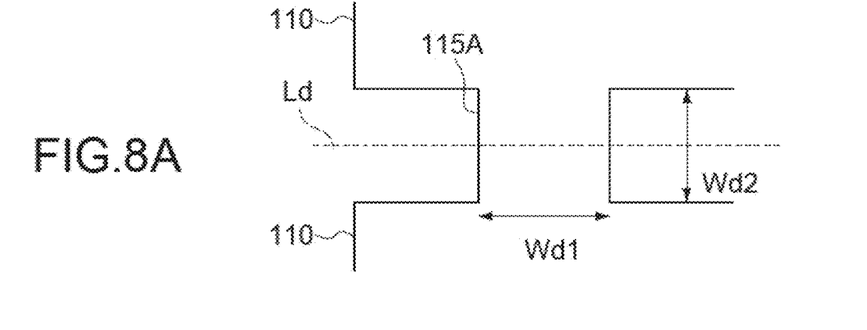
FIGS. 8A to 8C are schematic process diagrams of main parts for describing the manufacturing method for the circuit board.
Figure 8B:
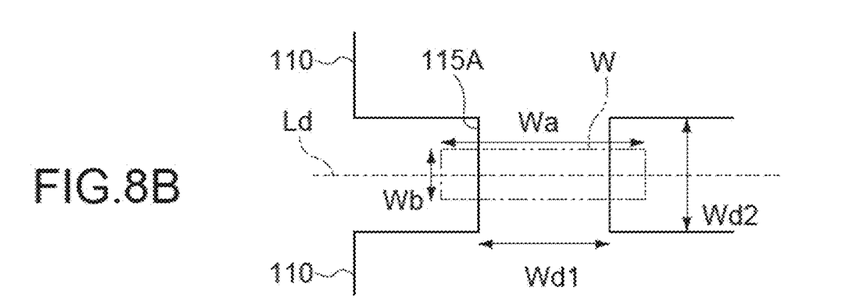

Here, in a case where the size of the window portion W (the width Wa×the length Wb) as shown in FIG. 8B is set, the window portion W is as follows in principle.

Assuming that the width of the bridge portion 115A is Wd1 (length along dicing line (division line Ld)) and the length of the bridge portion 115A is Wd2 (distance between the core base materials 110 each of which is the unit) as shown in FIG. 8A, the window portion W has an approximately rectangular or elliptical shape having Wa equal to or larger than Wd1 and having Wb smaller than Wd2 is obtained. It should be noted that Wb is larger than a blade width for allowing a dicing blade to pass.

The shape and size of the window portion W are not limited. The size of the window portion W only needs to be a size which enables the bridge portion 115A to be cut in the direction of the width Wd1. The shape or the like of the window portion W is also not limited to the rectangular shape shown in the figures. A circular shape, an elliptical shape, or the like may be employed as the shape of the window portion W.

Subsequently, as shown in FIGS. 4D and 6C, a part of the bridge portion 115A exposed to the outside via the window portion W is removed by dissolving. The dissolving method is not particularly limited and wet etching is employed in this embodiment. In FIG. 4D, the reference sign PR is a plating resist.

Figure 8C:
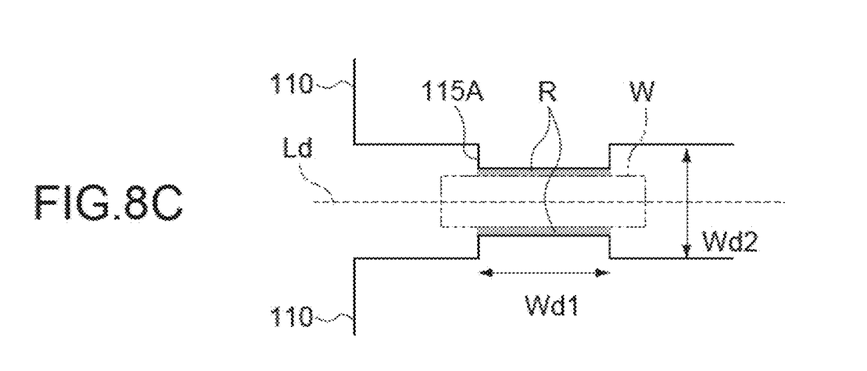

In general, wet etching has an isotropic etching property. Therefore, the bridge portion 115A is etched not only in the direction of the thickness thereof but also in an in-plane direction (horizontal direction) (side etching). Therefore, the bridge portion 115A is over-etched in an longer area, wider area than the window portion W. As a result, a dissolved cross-section of the bridge portion 115A is formed such that peripheral edges of the dissolved cross-section of the bridge portion 115A are positioned on inner surface (deeper) sides relative to peripheral edges of an opening of the first insulation layer 121, which forms the window portion W, as shown in FIGS. 4D and 8C. Regions R painted in gray in FIG. 8C correspond to over-etching regions in the bridge portion 115A. It can be seen that those are recessed on the respective sides of the core base materials 110 relative to the window portion W.

The side etching amount of the bridge portion 115A depends on the thickness of the bridge portion 115A, the opening width of the window portion W, the etching rate, and the like. When the side etching amount of the bridge portion 115A is too large, the side surfaces of the core base materials 110 are corroded. The side surfaces of the core base materials 110 may be etched, but it may affect the mount area. Therefore, for avoiding it, the process for removing the bridge portion 115A by dissolving is set such that it ends while parts of the bridge portion 115A are left on the side surfaces of the core base materials 110 as a condition. The remaining portions of the bridge portion 115A constitutes the projections 115 of the core base materials 110 and the dissolved cross-section of the bridge portion 115A forms the end surfaces 115s of the projections 115 (see FIG. 3).

It should be noted that also after the bridge portion 115A is cut, each core base material 110 is supported on the first insulation layer 121, the second insulation layer 122, and the third insulation layer (insulation material 41), and thus the respective relative positions are maintained as they are.

Subsequently, as shown in FIGS. 5A and 7A, a removed region of the first insulation layer 121 and the bridge portion 115A, i.e., an inside of the window portion W is filled with an insulation material 42. The resin material of the sealing portion 140 is used as the insulation material 42.

The filling method for the insulation material 42 is not particularly limited. A printing method such as vacuum printing, screen printing, potting, and pad printing, a resin filling method using a dispenser nozzle, or the like can be employed. After filling, the insulation material 42 is cured by heating.

A resin to be used for the insulation material 42 is not particularly limited. Typically, an epoxy-based resin is used for the insulation material 42 as described above. Since the insulation material 42 is filled into the outer cover 120 constituted by the first to third insulation layers 121 to 123, it is favorable that a material hardly contracted after it is cured and having such liquidity that minute clearances can be filled is employed for the insulation material 42. As the resin material of this kind, "THP-100 DX1" manufactured by TAIYO HOLDINGS CO., LTD. and the like can be exemplified, for example.

After the curing process of the insulation material 42, a process of flattening a top (bulging portion) of the insulation material 42 is performed as shown in FIGS. 5B and 7B. Buffing is employed for the flattening process, for example. The bulging portion of the insulation material 42, which projects from the upper surface of the first insulation layer 121, is removed in the flattening process.

If the bulging portion of the insulation material 42 remains as shown in FIG. 5A, the following problems arise.

First, such bulges are present at four sides of the substrate and those bulges have different amounts, and thus the flatness of the substrate may be deteriorated and stable arrangement may not be obtained. Second, in a case where a bulging portion is formed on the back side of the substrate, the bulging portion forms a clearance with a mother board when the substrate is mounted on the mother board. It causes a connection failure in a manner that depends on a solder height of the back surface of the substrate. Third, in a case where a bulging portion is formed on the front side of the substrate, components are tilted or a connection failure or the like is caused if the bulging portion covers the mount area. Therefore, it may be desirable to perform the flattening process for the insulation material 42 as shown in FIG. 5B. It should be noted that regarding the degree of flattening, it is sufficient to perform working which can form a surface substantially flat with respect to the substrate surface and a complete flat surface does not need to be formed by working. Note that in a case where the above-mentioned problems can be ignored, it is unnecessary to perform flattening.

Subsequently, the assembled board 110A is diced into respective core base materials 110 along the division line Ld as shown in FIGS. 5C and 7C with the dicer (not shown). With this, the insulation material (third insulation layer 123) and the sealing portions 140 filled in the apertures Ha are cut. As a result, the circuit boards 10 each including the outer cover 120 including those cut cross-sections in the peripheral surface are fabricated.

Since the portion of the window portion W includes the resin embedded in the core base materials due to over-etching as shown in FIG. 8C, the portion of the window portion W can be favorably cut without being pulled out due to the force of the blade in this dicing process.

It should be noted that the formation process for the solder resists SR1 and SR2 and the external connection terminals 31, the mounting process for the electronic components 21, and the formation process for the mold portion 30 are performed on the first wiring layer 131 and the second wiring layer 132 before dicing, and thus the circuit modules 100 shown in FIGS. 1 to 3 is fabricated in a batch.

As described above, in this embodiment, the fabrication process for the circuit board 10 includes the process of removing the bridge portions 115A coupling the plurality of core base materials 110 to one another by dissolving and the process of filling the insulation material 42 into the gaps of the bridge portions 115A by dissolving to form the sealing portions 140. Therefore, in the peripheral surface of the outer cover 120 of the manufactured circuit board 10 (or the circuit module 100), not the end surfaces 115s of the projections 115 but the sealing portions 140 covering those end surfaces 115s are exposed to the outside. With this, a connection failure such as a short circuit failure at the time of mounting by soldering is avoided. Therefore, the circuit module 100 having an ensured mounting reliability can be fabricated.

Further, in this embodiment, wet etching is employed for removing the bridge portions 115A by dissolving. Therefore, it becomes possible to adjust the position of the dissolved cross-section of the bridge portion 115A by utilizing side etching.

Figure 9:
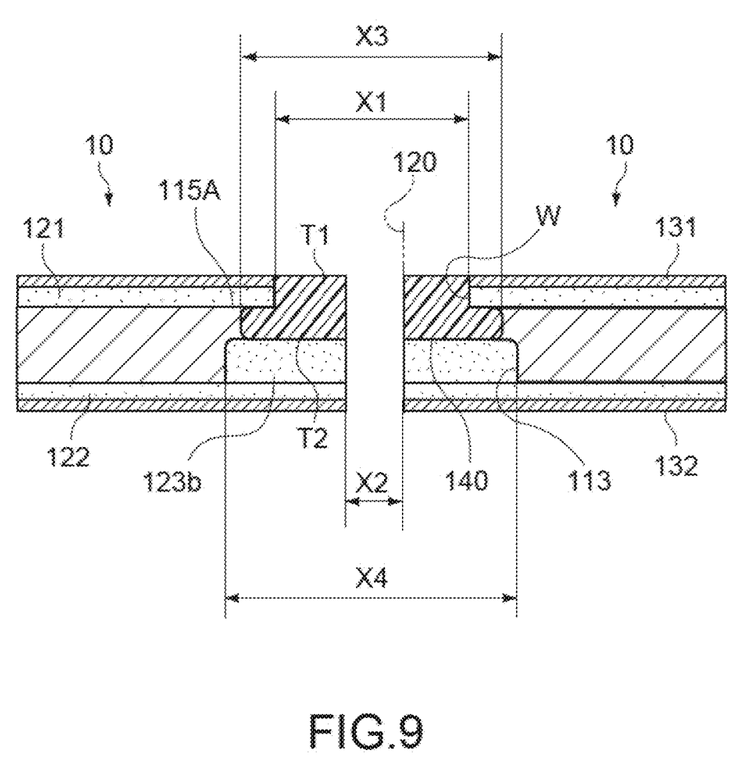
FIG. 9 is a schematic side cross-sectional view of main parts for describing the manufacturing method for the circuit board.

For example, as shown in FIG. 9, a width X1 of the window portion W (corresponding to Wb of FIG. 8A) formed when removing the bridge portion 115A by dissolving is larger than a width X2 of the dicer and is smaller than an etching width X3 of the bridge portion 115A. Further, assuming that a distance between the two side surfaces 113 of the core base materials 110 coupled to each other by the bridge portion 115A is X4, the width X1 of the window portion W only needs to be set such that the etching width X3 is not larger than the distance X4.

Although the embodiment of the present disclosure has been described above, the present disclosure is not limited only to the above-mentioned embodiment and various modifications can be made as a matter of course.

For example, in the above-mentioned embodiment, the number of wiring layers formed on each of the main surfaces of the circuit board 10 is one, though not limited thereto. A multi-layer wiring structure in which two or more wiring layers are formed on each of the main surfaces of the circuit board 10 may be employed. In this case, wiring layers are further formed on the wiring layers 131 and 132 with inter-layer insulation films interposed between the wiring layers and the wiring layers 131 and 132.

Further, in the above-mentioned embodiment, the core base material 110 including the component-containing hole 114a has been described as an example, though not limited thereto. A plurality of component-containing holes 114a may be provided or the component-containing hole 114a does not need to be formed.

Moreover, although the mold portion 30 is provided in FIG. 1, the mold portion 30 may be omitted.

As described above, the solder short-circuit can be inhibited due to the provision of the sealing portion 140 in the side surface. Moreover, by eliminating the bulge as shown in FIG. 5A from the front surface or the back surface of that sealing portion, the implementation property can be improved and the solder failure and the like can be eliminated.

On the other hand, by intentionally leaving the bulge on the back surface, a certain solder height (thickness) can be ensured at the time of fusion of the solder with the mother board and it is also conceivable that the reliability is improved.

What is claimed is:

1. A circuit board, comprising:
    a metal core base material including
        a first main surface,
        a second main surface on an opposite side of the first main surface,
        a side surface, and
        a projection that projects from the side surface;
    an outer cover including
        a first insulation layer that covers the first main surface,
        a second insulation layer that covers the second main surface, and
        a third insulation layer that covers the side surface;
    a first wiring layer provided in the first main surface with the first insulation layer interposed between the first wiring layer and the first main surface;

a second wiring layer provided in the second main surface with the second insulation layer interposed between the second wiring layer and the second main surface; and a sealing portion that is made of an insulation material embedded in the outer cover and covers an end surface of the projection, wherein the projection is located on a side of the first main surface with respect to a center of the side surface in a height direction, wherein the third insulation layer includes:
- a first portion located between the first insulation layer and the second insulation layer; and
- a second portion located between the second insulation layer and the projection, and wherein the sealing portion is arranged adjacent to the second portion in a thickness direction.

2. The circuit board according to claim 1, wherein the sealing portion includes
- an outer surface portion having a first thickness equal to a sum of a thickness of the projection, a thickness of the first insulation layer, and a thickness of the first wiring layer and being continuous with a peripheral surface of the outer cover, and
- an inner surface portion having a second thickness equal to the thickness of the projection and being adjacent to the end surface of the projection.

3. The circuit board according to claim 2, wherein the outer surface portion is formed on a same plane as the peripheral surface of the outer cover.

4. The circuit board according to claim 1, wherein the sealing portion is made of an insulation material including a same organic material as the outer cover.

* * * * *